US012707699B2

(12) United States Patent
Hiblot et al.

(10) Patent No.: US 12,707,699 B2
(45) Date of Patent: Aug. 11, 2026

(54) SEMICONDUCTOR DEVICE STRUCTURE

(71) Applicant: IMEC VZW, Leuven (BE)

(72) Inventors: Gaspard Hiblot, Leuven (BE); Julien Jussot, Kessel-Lo (BE)

(73) Assignee: Imec vzw, Leuven (BE)

( * ) Notice: Subject to any disclaimer, the term of this patent is extended or adjusted under 35 U.S.C. 154(b) by 370 days.

(21) Appl. No.: 18/543,315

(22) Filed: Dec. 18, 2023

(65) Prior Publication Data

US 2024/0204066 A1 Jun. 20, 2024

(30) Foreign Application Priority Data

Dec. 18, 2022 (EP) .................................... 22214407

(51) Int. Cl.

| | |
|---|---|
| ***H10B 10/00*** | (2023.01) |
| ***H10D 30/62*** | (2025.01) |
| ***H10D 30/67*** | (2025.01) |
| ***H10D 64/01*** | (2025.01) |
| ***H10D 64/23*** | (2025.01) |
| ***H10D 84/85*** | (2025.01) |

(52) U.S. Cl.

CPC ........... *H10D 64/257* (2025.01); *H10B 10/12* (2023.02); *H10D 30/62* (2025.01); *H10D 30/6219* (2025.01); *H10D 30/6757* (2025.01); *H10D 64/017* (2025.01); *H10D 84/853* (2025.01)

(58) Field of Classification Search

CPC ...... H10B 10/12; H10D 30/014; H10D 30/43; H10D 30/62; H10D 30/6219; H10D 30/6757; H10D 64/017; H10D 64/257; H10D 84/017; H10D 84/0172; H10D 84/038; H10D 84/85; H10D 84/853; H10D 89/10

See application file for complete search history.

(56) References Cited

U.S. PATENT DOCUMENTS

| | | | | |
|---|---|---|---|---|
| 11,164,942 | B1 | 11/2021 | Weckx et al. | |
| 2021/0375926 | A1* | 12/2021 | Mehandru | H10B 51/20 |
| 2022/0181322 | A1* | 6/2022 | Liebmann | H10D 84/856 |
| 2022/0199809 | A1 | 6/2022 | Ryckaert | |

(Continued)

OTHER PUBLICATIONS

Extended European Search Report and Search Opinion, Application No. EP 22214407.3, mailed Jun. 1, 2023, 8 pages.

(Continued)

*Primary Examiner* — Matthew C Landau
*Assistant Examiner* — Dmitriy Yemelyanov
(74) *Attorney, Agent, or Firm* — McDonnell Boehnen Hulbert & Berghoff LLP

(57) ABSTRACT

The disclosure relates to a semiconductor device structure. The device structure comprises a first and second FETs, each comprising respective S/D structures, a respective channel structure and a respective gate structure. Each S/D structure comprises an S/D body and a set of vertically spaced apart S/D prongs protruding laterally from the S/D body. The S/D prongs of the first and second FETs extend in opposite lateral directions. Each gate structure comprises a gate body and a set of gate prongs protruding laterally from the gate body into spaces between channel layers of the respective channel structures. The gate prongs of the first and second FETs extend in opposite lateral directions.

20 Claims, 3 Drawing Sheets

(56) References Cited

U.S. PATENT DOCUMENTS

2024/0222372 A1 * 7/2024 Olson ................ H10D 30/6735

OTHER PUBLICATIONS

Weckx, Pieter, Julien Ryckaert, E. Dentoni Litta, Dmitry Yakimets, Philippe Matagne, Pieter Schuddinck, Doyoung Jang et al. "Novel forksheet device architecture as ultimate logic scaling device towards 2nm." In 2019 IEEE International Electron Devices Meeting (IEDM), pp. 36-5. IEEE, 2019.

* cited by examiner

SEMICONDUCTOR DEVICE STRUCTURE

CROSS-REFERENCE TO RELATED APPLICATIONS

The present application is a non-provisional patent application claiming priority to European Patent Application No. EP 22214407.3, filed Dec. 18, 2022, the contents of which are hereby incorporated by reference.

FIELD OF THE DISCLOSURE

The present disclosure relates to a semiconductor device structure, a circuit cell, and an SRAM device.

BACKGROUND

Integrated circuit design involves combining a great number of circuit cells with different functionality. According to a standard cell methodology, the circuit cells may be selected as standard cells from a standard cell library, wherein each standard cell provides a predefined logic function. Two parameters of interest in modern integrated circuit design are the track height of the circuit cells and the contacted poly pitch (CPP) or contacted gate pitch (CGP). The track height is the number of routing tracks (metal tracks) per circuit cell and, together with the minimum track pitch (minimum metal pitch), defines the height of the circuit cell ("cell height"). The CPP is typically defined as the minimum distance between the gates of two adjacent transistors and thus dictates the width of the circuit cell ("cell width"). Device parameters limiting CPP scaling include gate length, source/drain contact area, and gate spacer width.

SUMMARY

The present disclosure provides a semiconductor device enabling design of more area efficient circuitry. More specifically, the present disclosure provides a semiconductor device facilitating continued CPP scaling and low track height circuit cell implementations.

In one example a semiconductor device structure is provided. The semiconductor device structure comprises a first field-effect transistor, FET, comprising: a first source/drain, S/D, structure, a second S/D structure, a first channel structure comprising a set of vertically spaced apart channel layers extending between the first and second S/D structures in a channel direction, and a first gate structure.

The first S/D structure comprises a first S/D body and a first set of vertically spaced apart S/D prongs protruding laterally from the first S/D body (e.g. a first lateral direction), transverse to the channel direction, to contact the first channel structure.

The second S/D structure comprises a second S/D body and a second set of vertically spaced apart S/D prongs protruding laterally from the second S/D body in a same direction as the first set of S/D prongs (e.g. the first lateral direction), to contact the first channel structure.

The first gate structure comprises a first gate body and a first set of gate prongs protruding laterally from the first gate body in an opposite direction to the first and second sets of S/D prongs (e.g. a second lateral direction), into spaces between the channel layers of the first channel structure.

The semiconductor device further comprises a second FET comprising: a third S/D structure, a fourth S/D structure, a second channel structure comprising a set of vertically spaced apart channel layers extending between the third and fourth S/D structures in the channel direction, and a second gate structure.

The third S/D structure comprises a third S/D body and a third set of vertically spaced apart S/D prongs protruding laterally from the third S/D body in the same direction as the first set of gate prongs (e.g. the second lateral direction), to contact the second channel structure.

The fourth S/D structure comprises a fourth S/D body and a fourth set of vertically spaced apart S/D prongs protruding laterally from the fourth S/D body in the same direction as the third set of S/D prongs (e.g. the second lateral direction), to contact the second channel structure.

The second gate structure comprises a second gate body and a second set of gate prongs protruding from the second gate body in the same direction as the first and second sets of S/D prongs (e.g. the first lateral direction), into spaces between the channel layers of the second channel structure.

The first S/D body of the first FET device is arranged between the third and fourth S/D bodies of the second FET device. The fourth S/D body of the second FET device is arranged between the first and second S/D bodies of the first FET device.

The semiconductor device structure of the present aspect hence comprises a first FET and a second FET, wherein each FET comprises a pair of S/D bodies and a gate body each laterally offset of the line of sight of the channel layers of the channel structure, wherein further the gate body and the S/D bodies are arranged at laterally opposite sides of the channel structure. Meanwhile, the gate prongs of the respective FETs may be offset vertically with respect to the source and drain prongs. By this design, the dielectric spacer (e.g. gate spacer) which typically is present between the gate and each S/D in a conventional FET (and hence appears twice in the CPP) may be reduced in thickness, or even omitted.

Furthermore, the semiconductor device structure makes use of the space defined by the horizontal separation between the respective pairs of S/D bodies along the channel direction to accommodate an S/D body of the other FET. The S/D bodies of the first and second transistors may accordingly be collapsed along a common geometrical line. This further contributes to enabling an area efficient device design. In a circuit cell, the common geometrical line may correspond to a routing track of the cell. As may be appreciated, this enables low track height cell implementations wherein, additionally, the reduced CPP of the first and second FETs may enable scaling of the cell width.

The term "lateral" as used herein indicates an orientation or a direction in a horizontal plane, i.e. parallel to a main plane of a substrate of the semiconductor device structure (and/or as the case may be of a circuit cell comprising the semiconductor device structure). Correspondingly, the term "vertical" is used to indicate an orientation or a direction which is perpendicular to the horizontal plane, i.e. perpendicular or normal to the main plane of the substrate (or the circuit cell).

The term "S/D prong" as used herein refers to a portion (e.g. layer-shaped) of the S/D structure protruding from the respective S/D body to a respective free end. The term "S/D body" as used herein meanwhile refers to a continuous body portion of the S/D structure from which each of the respective S/D prongs protrude. The S/D prongs of a S/D structure are hence connected by the (common) S/D body of the S/D structure.

The term "gate prong" as used herein refers to a portion (e.g. layer-shaped) of the gate structure protruding from the gate body to a respective free end. The term "gate body" as used herein meanwhile refers to a continuous body portion of the gate structure from which each of the respective gate prongs protrude. The gate prongs of a gate structure are hence connected by the (common) gate body of the gate structure.

The term "source/drain" ("S/D") structure as used herein may refer to either a source or a drain structure. Whether an S/D structure of a FET will function as a source or a drain, or both, will depend on e.g. how the FET is connected to surrounding circuitry and the conductivity type of the FET.

In some embodiments, the semiconductor device structure may further comprise a dielectric spacer layer separating the first S/D body of the first FET from the third and fourth S/D bodies of the second FET, and the fourth S/D body of the second FET from the first and second S/D bodies of the first FET.

The dielectric spacer layer may further separate the first S/D body of the first FET from the second gate structure of the second FET, and the fourth S/D body of the second FET from the first gate structure of the first FET.

The S/D bodies of the respective FETs may hence be electrically isolated from the respective S/D bodies and gate structure of the other FET.

The dielectric spacer layer may extend continuously from the second S/D body to the third S/D body. This may facilitate forming the semiconductor device structure with a small footprint.

In some embodiments, the S/D prongs may comprise semiconductor material and the S/D bodies comprise semiconductor material and/or metal. The S/D prongs may for instance be formed by epitaxial semiconductor material (e.g. grown/deposited on the channel layers of the respective channel structures). The S/D bodies may each be or comprise an epitaxial (epitaxially grown) semiconductor body portion. The first S/D body may connect (e.g. "merge") the first set of S/D prongs. The second S/D body may connect the second set of S/D prongs. The S/D bodies may also or alternatively each comprise metal. The S/D bodies may each be or comprise a metal body portion. The metal body portion may form a metal contact of the S/D body and S/D structure. The metal body portion/contact may be formed on the semiconductor body portion of the S/D body. The metal body portion/contact may form a wrap-around contact on the semiconductor body portion.

In some embodiments, the semiconductor device structure may further comprise a third FET comprising the fourth S/D structure, a fifth S/D structure, a third channel structure comprising a set of vertically spaced apart channel layers extending between the fourth and fifth S/D structures in the channel direction, and a third gate structure. The fourth set of S/D prongs may further contact the third channel structure (wherein the fourth S/D structure accordingly may be shared by the second FET and the third FET). The fifth S/D structure may comprise a fifth S/D body, and a fifth set of vertically spaced apart S/D prongs protruding laterally from the fifth S/D body (e.g. the second lateral direction) in the same direction as the third and fourth sets of S/D prongs, to contact the third channel structure. The third gate structure may comprise a third gate body protruding laterally from the third gate body in the same direction as the second set of gate prongs (e.g. the first lateral direction), into spaces between the channel layers of the third channel structure. The second S/D body may be arranged between the fourth and fifth S/D bodies.

The semiconductor device structure may accordingly further comprise a third FET comprising S/D prongs and gate prongs protruding in the same respective lateral directions as the S/D prongs and gate prongs of the second FET. The functionality discussed above with reference to the first and second FETs apply correspondingly to the first and third FET. Additionally, sharing the fourth S/D structure between the second FET and the third FET may allow a tight device spacing along the channel direction, and hence enable a reduced cell width.

In another example, a circuit cell for an integrated circuit is provided. The circuit cell comprising a semiconductor device structure according to the first aspect or any of the embodiments and variations thereof set out above. As may be appreciated from the above discussion, this enables an area efficient and low track height realization of a circuit cell.

As used herein, the term "circuit cell" refers to a circuit comprising the semiconductor device structure and being configured to provide a certain functionality. Example types of cells include logic cells and memory cells, such as those typically found in standard cell libraries, comprising for instance NAND, NOR, D-flip flop, multiplexers etc. The circuit cell may be a unit cell, i.e. defining a minimum functional unit (e.g. a logic function). The circuit cell may be a standard cell for a standard cell device. A standard cell device may comprise a plurality of such unit cells, e.g. in combination with other unit cells with other functions, interconnected to provide a desired functionality.

In some embodiments, the circuit cell may comprise a first half-cell and a second half-cell, wherein each one of the first and second half-cells comprises a respective semiconductor device structure according to the first aspect. The first set of S/D prongs of the first S/D structure of the first transistor of the first half-cell may protrude in a first lateral direction and the first set of S/D prongs of the first S/D structure of the first transistor of the second half-cell may protrude in a second lateral direction opposite the first lateral direction.

The first gate body of the first FET of the first half-cell may be arranged along a lower cell boundary of the circuit cell and the first gate body of the first FET of the second half-cell may be arranged along an upper cell boundary of the circuit cell.

In some embodiments, the first half-cell and the second half-cell may each comprise a respective third FET, as set out above. Two three-transistor half-cells may hence be combined to form a six-transistor circuit cell.

The circuit cell may further comprise first through sixth routing tracks extending in parallel and spaced apart along a height dimension of the circuit cell. The first and sixth routing tracks may define edge tracks of the circuit cell.

In the first half-cell: the first gate structure may be arranged along the first routing track, the first, second, third, fourth, and fifth S/D bodies of the first, second, third, fourth, and fifth S/D structures may be arranged along the second routing track, and the second and third gate structures may be arranged along the third routing track.

In the second half-cell: the first gate structure may be arranged along the sixth routing track, the first, second, third, fourth, and fifth S/D bodies of the first, second, third, fourth, and fifth S/D structures may be arranged along the fifth routing track, and the second and third gate structures may be arranged along the fourth routing track.

The six FETs may hence be combined in an area efficient 6-track circuit cell. For example, such an arrangement may include the first gate structure of the first FET of the first half-cell disposed along the first track (e.g. a bottom edge track) and the first FET of the second half-cell disposed along the sixth track (e.g. a top edge track).

As used herein, the terms "track height" or "cell height" refers to a dimension of the cell as seen along a direction transverse to the routing tracks. E.g. a track or cell height of three (3) tracks indicates (in units of number of tracks) that an extension of the cell as seen along a direction transverse to the routing tracks (e.g. the first lateral direction) is three (3). Correspondingly, the term "cell width" is used to denote a dimension along the direction of the routing tracks (which is parallel to a channel direction of the channel layers/FET devices).

As used herein, the term "routing track" (or shorter "track") is used in the normal sense of the word to denote a horizontally extending geometrical track or lane defining a position or place holder for a routing resource in the form of a conductive line in relation to the circuit cell. A plurality of routing tracks are typically defined to extend in parallel to each other and have a uniform spacing and pitch. As may be appreciated by a skilled person, during a design phase of a standard cell semiconductor device, the presence of a routing track indicates a position available for a routing resource. In an actual circuit cell a conductive line (e.g. of metal) may be provided along the routing track if the routing resource provided by the routing track is to be used, or a dummy line (e.g. of an insulating material) may be provided along the routing track if the routing resource if the routing track is not be used. Generally, unless stated otherwise, a feature (e.g. a line) extending along a given track may be understood as the feature extending along and coinciding with said track, i.e. the being accommodated within the routing track.

In some embodiments, the first half-cell may further comprise a first pair of dummy gate structures arranged along the first routing track, wherein the first gate structure of the first half-cell may be arranged between the first pair of dummy gate structures, and the second half-cell may further comprise a second pair of dummy gate structures arranged along the sixth routing track, wherein the first gate structure of the second half-cell may be arranged between the second pair of dummy gate structures.

In some embodiments, the first FET of the first half-cell and each one of the first, second and third FETs of the second half-cell may be N-type FETs, and the second and third FETs of the first half-cell may be P-type FETs.

A circuit cell according to such a layout lends itself favorably to a latch-circuit comprising two cross-coupled CMOS inverter pairs. In particular, the circuit cell may form a static random access memory, SRAM, bit cell.

In some embodiments, the first gate structure of the first half-cell, and the first, second and third gate structures of the second half-cell may each comprise an N-type gate stack, and the second and third gate structures of the first half-cell may each comprise a P-type gate stack.

In another example, a SRAM device comprising an array of such bit cells is disclosed.

BRIEF DESCRIPTION OF THE DRAWINGS

The above, as well as additional objects, features and functionality, may be better understood through the following illustrative and non-limiting detailed description, with reference to the appended drawings. In the drawings like reference numerals will be used for like elements unless stated otherwise.

DETAILED DESCRIPTION

Figure 1:
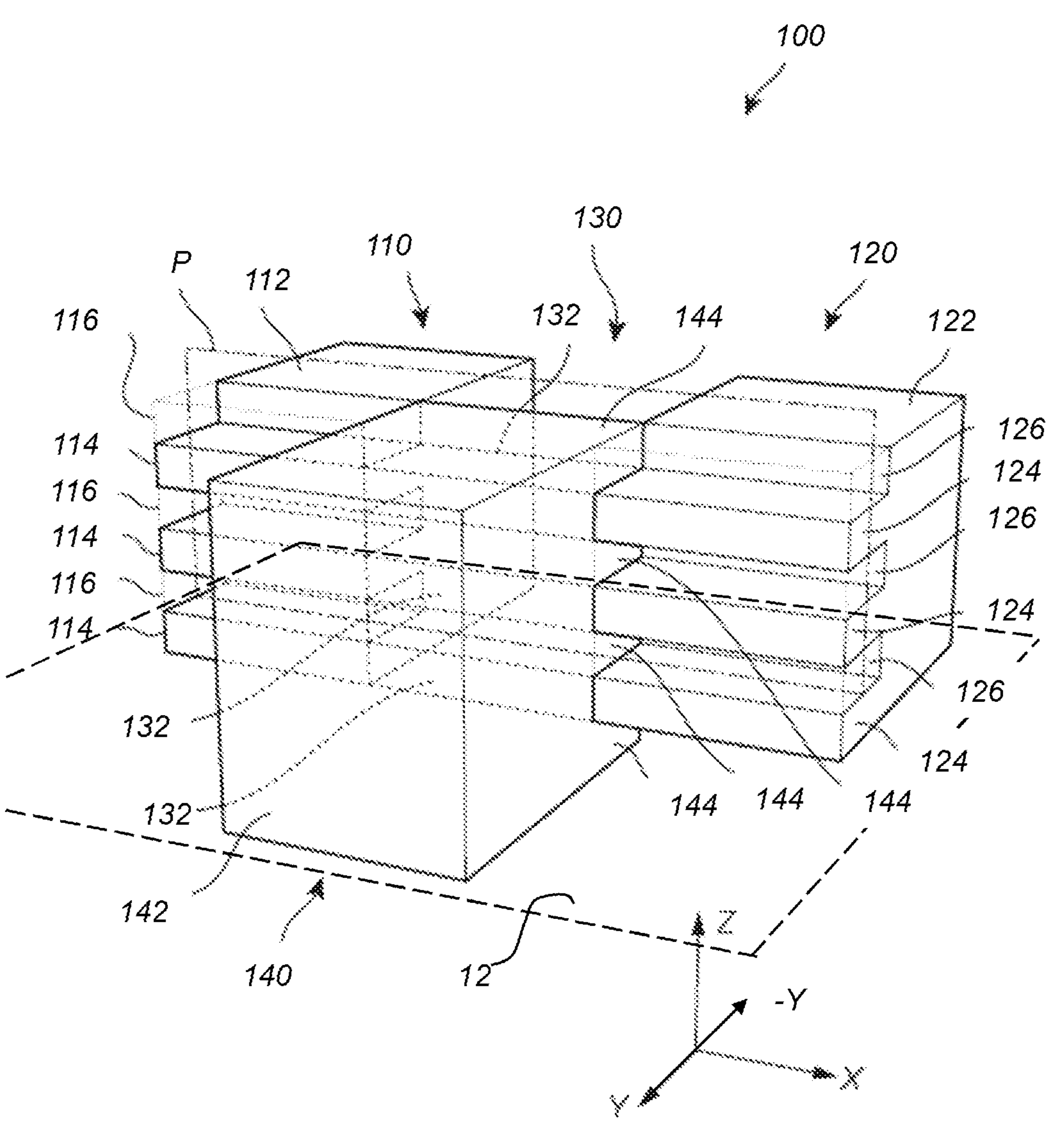
FIG. 1 is a schematic perspective view of a FET defining a building block for a semiconductor device structure according to some embodiments.

FIG. 1 shows a FET device 100 which may be used as a building block in embodiments as set out herein. Reference sign 12 schematically indicates a substrate 12 supporting the FET device 100. The substrate 12 may be a semiconductor substrate, i.e. a substrate comprising at least one semiconductor layer, e.g. of Si, SiGe or Ge. The substrate 12 may be a single-layered semiconductor substrate, for instance formed by a bulk substrate. A multi-layered/composite substrate 12 is however also possible, an epitaxially grown semiconductor layer on a bulk substrate, or a semiconductor-on-insulator (SOI) substrate. As may be appreciated, the substrate 12 may be covered by an insulating layer (e.g. silicon oxide or other conventional inter-layer dielectric material) forming a bottom isolation underneath and surrounding the FET device 12.

In the FIG. 1 and subsequent figures, axis X indicates a channel direction, Y indicates a first lateral direction transverse to the X-direction, −Y (negative Y) indicates a second lateral direction opposite the Y-direction and Z indicates a vertical direction. The XY-plane is parallel to the main plane of extension of the substrate 12, while the ZX- and ZY-planes are normal thereto.

The FET device 100 comprises a first S/D structure 110, a second S/D structure 120, a first channel structure 130, and a gate structure 140.

The first S/D structure 110 comprises a first S/D body 112 and a first set of S/D prongs 114. The first set S/D prongs 114 are vertically spaced apart in the Z-direction and protrude laterally from the first S/D body 112 in the Y-direction to contact the first channel structure 130. The first S/D body 112 defines a common S/D body for the first set of S/D prongs 114 in the sense that it connects or merges the first set of S/D prongs 114.

The second S/D structure 120 comprises a second S/D body 122 and a second set of S/D prongs 124. The second set of S/D prongs 124 are vertically spaced apart in the Z-direction and protrude laterally from the second S/D body 122 in the Y-direction (i.e. in the same direction as the first set of S/D prongs 114) to contact the first channel structure 130. The first set of S/D prongs 114 and the second set of S/D prongs 124 contact the first channel structure 130 from opposite ends thereof. The second S/D body 122 defines a common S/D body for the second set of S/D prongs 124 in the sense that it connects or merges the second set of S/D prongs 124.

The first and second sets of S/D prongs 114, 124 may each comprise semiconductor material. The S/D prongs 114, 124 may for example be epitaxial semiconductor S/D prongs 114, 124. The S/D prongs 114, 124 may for example be formed of Si or SiGe, on Si- or SiGe-channel layers 112. The S/D prongs 114, 124 may be doped with N-type or P-type dopants, in accordance with the desired conductivity type of the FET 100.

The first and second S/D bodies 112, 122 may each comprise semiconductor material. The S/D bodies 112, 122 may be formed as respective epitaxial semiconductor bodies or body portions, e.g. of a same material as the S/D prongs 114, 124. The S/D bodies 112, 122 may for example be formed by epitaxially growing S/D material (e.g. SiGe) to form the S/D prongs 114, 124 and continuing the epitaxy such that the S/D material merges, wherein the merged portions defines a respective semiconductor S/D body 112, 122.

The S/D bodies 112, 122 may further comprise metal, formed in contact with a merged semiconductor body portion. The S/D bodies 112, 122 may hence form metal-semiconductor S/D bodies 112, 122, each comprising a semiconductor body portion and a metal body portion. The metal body portion may define a metal contact of the respective S/D structures 110, 120. The S/D bodies 112, 122 may alternatively be formed by a metal body, formed in contact with non-merged end-portions of the respective sets of S/D prongs 114, 124. In either case, the metal body or metal body portions may form wrap-around contacts for either merged semiconductor portions, or non-merged end-portions of the S/D prongs 114, 124. Example metals include W, Al, Ru, Mo or Co, but more generally any metal conventionally used as S/D electrode/contact material may be used. The S/D bodies 112, 122 may further comprise a barrier metal layer, e.g. Ta or TaN, as well as a silicide layer between the metal and the semiconductor material (e.g. of the S/D body or S/D prongs).

The channel structure 130 comprises a set of vertically spaced apart channel layer portions or channel layers 132. Each channel layer 132 extends in the X-direction between a respective pair of a first S/D prong 114 and a second S/D prong 124. Accordingly, each pair of a first and second S/D prong 114, 124 are connected by a respective channel layer 132. More specifically, as indicated in FIG. 1, each channel layer 132 may hence be level with a respective pair of first and second S/D prongs 114, 124. In the depicted embodiment, the S/D prongs 114, 124 are coextensive with the channel layers 132 along the Y-direction (i.e. coextensive with the width of the channel layers 132). Additionally, the channel layers 132 are shown to terminate at the S/D prongs 114, 134 wherein S/D prongs 114, 134 are arranged in contact with opposite end surfaces of a respective channel layer 132. It is however envisaged that depending e.g. on the particular process used to form the S/D prongs 114, 124, the S/D prongs 114, 124 may protrude into cavities extending only partly through the width of the channel layers 132.

The channel layers 132 may be formed of a semiconductor material, such as a Si-comprising semiconductor material. The channel layers 132 may for example be Si- or SiGe-layers (e.g. nanosheets). These materials are however only examples and it is contemplated that also other semiconductors may be used, such as Ge or group III-V semiconductors (e.g. InP, InAs, GaAs, GaN). Further examples include channel layers 132 formed by thin-film layers. Each channel layer 132 for example be formed by a 2D material such as a transition metal dichalcogenide ($MX_2$) or IGZO.

The S/D prongs 114, 124 and the channel layers 132 may each be formed with a nanosheet-shape. A nanosheet may by way of example have a width (along the Y-direction) in a range from 7 nm to 30 nm and a thickness (along the Z-direction) in a range from 2 nm to 10 nm.

The gate structure 140 comprises a first gate body 142 and a set of gate prongs 144. The set of gate prongs 144 are vertically spaced apart in the Z-direction and protrude laterally from the first gate body 142 in the negative Y-direction (−Y) (i.e. opposite to the first and second sets of S/D prongs 114, 124), into spaces between the channel layers 132 of the channel structure 130. Each channel layers 132 thus extends through a space above and/or underneath a gate prong 144.

The gate structure 140 may comprise a gate stack of a conventional composition, such as a high-k gate dielectric (e.g. $HfO_2$, HfSiO, LaO, AlO or ZrO), one or more work function metal (WFM) layers (e.g. an N-type WFM such as TiAl or TiAlC to form an N-type gate stack for an NFET 100), or a P-type WFM such as TiN or TaN for a PFET 100), and gate fill metal (e.g. W, Al, Co or Ru).

Each one of the first and second S/D structures 110, 120 and the gate structure 140, with its respective common body 112, 122, 142 and laterally extending prongs 114, 124, 144, may as shown in FIG. 1 form a respective fork- or E-shaped body (with a number of legs corresponding to the number of prongs) wherein the fork/E of the gate structure 140 faces in the opposite direction to the fork/E of the S/D structures 110, 120.

FIG. 1 further indicates a geometrical vertical plane P (parallel to the XZ-plane). The plane P is defined to extend through the first and second sets of S/D prongs 114, 124, the channel structure 130 and the gate prongs 144. Accordingly, the first and second S/D bodies 112, 122 and the gate body 142 are arranged at mutually opposite sides of the plane P. This design, combined with the vertical offset between the gate prongs 144 and the S/D prongs 114, 124, allows a mutual overlap between the S/D structures 110, 120 and the gate body 140 to be minimized. The need for an insulating gate spacer therebetween to ensure a sufficient physical and electrical separation along the X-direction is hence reduced.

The FET 100 may as shown further comprise a first set of insulating spacer layer portions 116 arranged in spaces between the first S/D prongs 114, and a second set of insulating spacer layer portions 126 arranged in spaces between the second S/D prongs 124. Each gate prong 144 may hence be level with and surrounded by a pair of insulating spacer layer portions 116, 126, as viewed along the X-direction. The insulating spacer layer portions 116, 126 may comprise an oxide or a nitride material. The insulating spacer layer portions 116, 126 may for instance be formed of a $SiGeO_x$, $SiO_2$, SiN or (low-k) SiCO. The FET 100 as depicted may in other words comprise an alternating arrangement of first and second device levels, wherein a pair of insulating spacer layer portions 116, 126 and a gate prong 144 is arranged in each first device level, and a pair of first and second S/D prongs 114, 124 and a channel layer 132 is arranged in each second device level.

Figure 2:
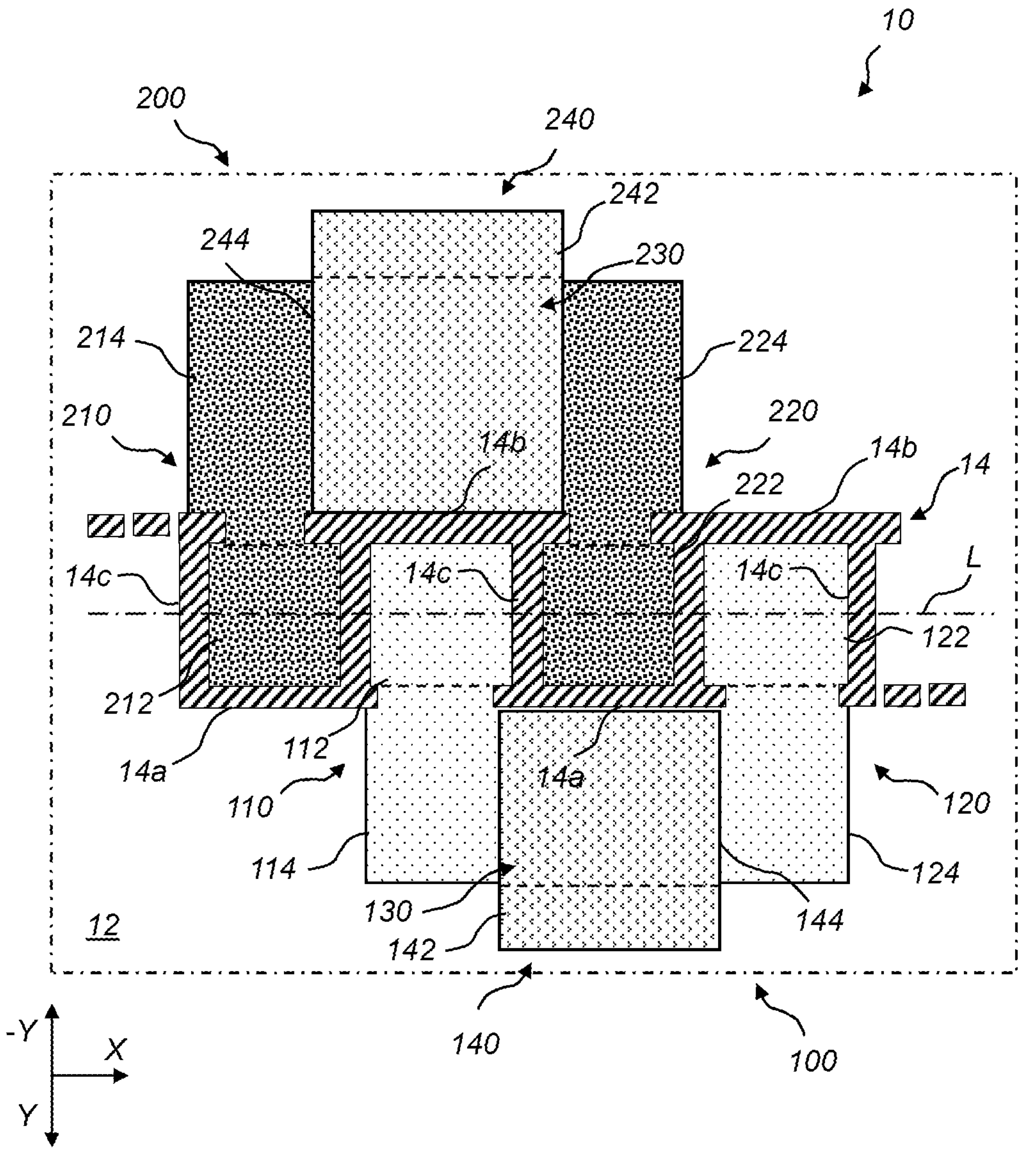
FIG. 2 is a schematic top-down view of a semiconductor device structure according to some embodiments.

FIG. 2 is a schematic top-down view of a semiconductor device structure 10 comprising a combination of a first and a second FET 100, 200, each with a design corresponding to the FET 100 shown in FIG. 1. In FIG. 2, elements identified with references formatted and identified as 1*xy* and 2*xy* denote corresponding elements 1*xy* identified and discussed as part of the device 100 shown in FIG. 1. A description of corresponding elements will hence not be repeated. The locations of the respective channel structures of the first and second FET 100, 200 are generally indicated by the reference signs 130, 230, but are due to the top-down perspective of FIG. 2 hidden by a respective top-most gate prong 144, 244 of the respective gate structure 140, 240 of the first and second FET 100, 200.

As shown, the second FET 200 comprises a third S/D structure 210, a fourth S/D structure 220, a second channel structure 230 (comprising a set of vertically spaced apart channel layers) extending between the third and fourth S/D structures 210, 220 in the X-direction, and a second gate structure 240.

In the illustrated example, the third and fourth S/D structures 210, 220 are provided with a different fill pattern than the first and second S/D structures 110, 120 to signify that the first and second FETs 100, 200 may be a CMOS pair. For instance, the first FET 100 may be an N-type FET and the second FET 200 may be a P-type FET. While the gate structures 140, 240 are shown with a same fill pattern the gate structures may comprise gate stacks of different conductivity types. For instance, the first FET 100 may be an N-type FET and the first gate structure 140 may comprise an N-type gate stack, and the second FET 200 may be a P-type FET and the second gate structure 140 may comprise a P-type gate stack.

The third S/D structure 210 comprises a third S/D body 212 and a third set of vertically spaced apart S/D prongs 214 protruding from the third S/D body (212) in the negative Y-direction (−Y) (in the same direction as the first set of gate prongs 114) to contact the second channel structure 230.

The fourth S/D structure 220 comprises a fourth S/D body 222 and a fourth set of vertically spaced apart S/D prongs 224 protruding from the fourth S/D body 222 in the negative Y-direction (−Y) (in the same direction as the third set of S/D prongs 214 and the first set of gate prongs 114) to contact the second channel structure 230. The third set of S/D prongs 214 and the fourth set of S/D prongs 224 contact the second channel structure 230 from opposite ends thereof.

The second gate structure 240 comprises a second gate body 242 and a second set of gate prongs 244 protruding from the second gate body 242 in the Y-direction (in the same direction as the first and second sets of S/D prongs 114, 124) into spaces between the channel layers of the second channel structure 230.

According to the semiconductor device structure 10 as shown, the first S/D body 112 is arranged between the third and fourth S/D bodies 212, 222. The fourth S/D body 222 is correspondingly arranged between the first and second S/D bodies 112, 114. Hence, the first through fourth S/D bodies 112, 122, 212, 222 of the first and second FETs 100, 200 are arranged along a common geometrical line L extending in the X-direction. The horizontal space available between the first and second S/D bodies 112, 122, on the one hand, and the third and fourth S/D bodies 212, 222, on the other hand, which otherwise would be un-used (e.g. filled with dielectric) is hence used to accommodate a S/D body of the other FET 100, 200. This enables the first and second FETs 100, 200 to be combined within a small footprint.

The semiconductor device structure 10 as shown further comprises a dielectric spacer layer 14 separating the first S/D body 112 from the third and fourth S/D bodies 212, 222, and the fourth S/D body 222 from the first and second S/D bodies 112, 114. The dielectric spacer layer 14 further separates the first S/D body 112 from the second gate structure 240 (more specifically the second set of gate prongs 244), and the fourth S/D body 222 from the first gate structure 140 (more specifically the first set of gate prongs 144). The dielectric spacer layer 14 extends continuously, in an undulating or crenelating fashion, from the second S/D body 122 to the third S/D body 212. More specifically, as shown the dielectric spacer layer 14 comprises first and second spacer layer portions 14*a*-*b* extending in the X-direction, and bridging portions 14*c* extending in the Y-direction between and connecting the first and second spacer layer portions 14*a*-*b*. The dielectric spacer layer 14 may be formed as a liner layer, e.g. a thin layer (wherein thin refers to the thickness in a horizontal plane) for instance in a range from 5 to 10 nm. The dielectric spacer layer 14 may be formed of an oxide or nitride material, or combinations thereof. Example materials include $AlO_x$, SiN, SiCO, SiC, SiCN, SiOCN, SiBCN or SiBCNO. The dielectric spacer layer 14 may for instance be formed of one or more layers of a conformally deposited dielectric material, e.g. a layer of nitride deposited by atomic layer deposition.

A fabrication process for a semiconductor device structure according to the present disclosure, such as the structure 10, may comprise forming a number of FETs 100 with a design as shown in FIG. 1. A fabrication process for such a FET 100 may be based on processing of a multi-layered stack of nanosheets, e.g. patterned in the shape of an elongated fin structure on a substrate. The stack may as an example comprise an alternating stack of channel layers and non-channel layers. The channel layers may be Si layers and the non-channel layers may be SiGe layers, or vice versa. The semiconductor material of the non-channel layers may be replaced by an insulating material, such as $SiGeO_x$, $SiO_2$, SiN or (low-k) SiCO, SiC, SiCN, SiOCN, SiBCN or SiBCNO. Non-channel layers of $SiGeO_x$ or $SiO_2$ may for example be formed by selectively oxidizing the SiGe- or Si-layers. Alternatively, the replacement may comprise removing the non-channel layers (e.g. Si- or SiGe-layers) using a selective etch to form longitudinal cavities in the fin structure at the positions of the removed layers, and then filling the thusly formed cavities in the fin structure with the insulating material. According to a further example, a fin structure comprising insulating non-channel layers and semiconductor channel layers may be formed directly by patterning fin structures a multi-layered SOI structure (e.g. $Si/SiO_2/Si/SiO_2/Si/\ldots$). The fin structure may in either case subsequently be embedded in an oxide, e.g. an interlayer dielectric (such as a shallow trench isolation oxide) of a different material than the insulating material of the non-channel layers. Prior to being embedded in oxide, a liner may be conformally deposited over the fin structure (e.g. a SiN-layer deposited by atomic layer deposition). First and second S/D structures may subsequently be formed by opening a "first S/D trench" and a "second S/D trench" in the embedding oxide selectively at the side of the fin structure where the S/D bodies of the respective S/D structures are desired. After opening the liner from the S/D trenches, the channel layers may then be etched isotropically from the S/D trenches to form first and second sets of S/D cavities in the channel layers of the fin structure. S/D bodies comprising S/D prongs (in the S/D cavities) and S/D bodies (in the S/D trenches) may then be formed by epitaxially growing S/D material from surface portions of the channel layers exposed in the S/D cavities. The epitaxial growth may be continued at least until the S/D cavities have been filled with S/D prongs, and optionally further be continued until merged portions of epitaxial S/D material joining the S/D prongs have been formed in the respective S/D trenches. A gate body may be formed in a corresponding fashion, by forming a gate trench on the opposite side of the fin structure, after opening the liner from the gate trench isotropically etching the non-channel layers from the gate trench to form gate cavities in the non-channel layers, and subsequently depositing a gate stack (e.g. gate dielectric, one or more WFMs, and gate electrode material) in the gate cavities and the gate trench.

By forming first and second S/D trenches and third and fourth S/D trenches in a row between two parallel fin structures, two FETs (such as the FETs 100 and 200) may be formed adjacent each other. For example, the first and second S/D trenches may be formed first, each trench exposing the liner on the two fin structures (e.g. with reference to FIG. 2 the liner 14*a* on the first fin structure and the liner 14*b* on the second fin structure). The sidewalls of the first and second S/D trenches may then be provided with a further liner layer. The further liner may be formed of a same material as the liner on the two fin structures and be formed using a sidewall spacer formation process (e.g.

comprising a conformal deposition of liner material, followed by an anisotropic top-down etch such that the deposited liner material is removed from horizontally oriented surfaces of the device structure, and remains on the vertically oriented sidewalls of the S/D trenches). The liner on the two fin structures on opposite sides of the first and second S/D trenches may accordingly be bridged or joined by the further liner layer (e.g. with reference to FIG. 2 the bridging liner portions 14*c*). Portions of the combined liner layer on the first fin structure (e.g. the original liner layer 14*a* and the non-bridging portions of the further liner layer formed thereon) may then be opened from the first and second S/D trenches in a lithography and etching step, wherein the channel layers of the first fin structure may be etched isotropically to form the first and second sets of S/D cavities therein. The etch mask used in the lithography and etching mask may be formed to mask the bridging portions of the further liner layer (e.g. the bridging liner portions 14*c*), and the combined liner layer portions on the second fin structure (e.g. the original liner layer 14*b* and the non-bridging portions of the further liner layer formed thereon). A corresponding process may be repeated to form the third and fourth S/D trenches and the third and fourth sets of S/D cavities.

It is envisaged that a number of such first and second FETs may be formed along a pair of parallel fin structures. Insulating walls between FETs along a same fin structure may be formed at selected positions along each fin structure (e.g. prior to the S/D epitaxy) by forming a cut in each fin and filling the cut with an insulating wall material.

In the above, a semiconductor device 10 comprising two FETs corresponding to the FET 100 as shown in FIG. 1 have been discussed. According to the FET 100, each pair of S/D prongs 114, 124 is located in a same horizontal plane as the channel layer 132 connecting the same. According to a FET of an alternative design, the pairs of S/D prongs and the channel layers may however be vertically offset with respect to each other. Each channel layer may thus comprise a first side arranged in abutment with a topside or an underside of a pair of S/D prongs, and a second side facing a gate prong. As may be appreciated, if a channel layer abuts a topside of a pair of S/D prongs, the first side corresponds to an underside of the channel layer, and if a channel layer abuts an underside of a pair of S/D prongs the first side corresponds to a topside of the channel layer. For example, a pair of channel layers may be arranged in abutment with a same pair of S/D prongs from mutually opposite sides thereof such that the pair of S/D prongs are sandwiched between the pair of channel layers. The device may comprise a set of vertically spaced apart insulating S/D spacer layers arranged level with and between each respective pair of the S/D prongs.

Accordingly, the FET 100 and the FET of the alternative design have as a common feature a common gate body arranged at a laterally opposite side to the S/D bodies. Additionally, the gate prongs are according to both device designs offset vertically with respect to the S/D prongs. However, while the S/D 114, 124 of the FET device 100 are level with the channel layers 132, the S/D prongs of the FET device of the alternative design are offset vertically from both the gate prongs and the channel layers. This enables a device design wherein a gate prong and a S/D prong may be arranged to overlap with a common region of a channel layer such that the common region is located vertically between the S/D prong and the gate prong. It is to be understood that a corresponding overlapping arrangement may be provided both at the source side and the drain side of the FET (i.e. between a source prong and the gate prong, and between a drain prong and the gate prong). In addition to enabling an increased contact area between the S/D prong and the channel layer, the common overlapping arrangement of the S/D prong and the gate prong with respect to the channel layer may allow "dynamic doping" of the channel layer during operation of the device. That is, the gate body may, in use of the FET, be configured to, when the FET is switched to an active state, induce an electrostatic doping in the respective common overlap regions of the channel layer at the source- and drain side. The common regions may thus have a respective first doping level when the FET is inactive, and a respective electrostatically increased second doping level when the FET is active. A further function of the gate spacer in a conventional FET is to limit the amount of dopant diffusion into the channel region. The "dynamic doping" allows reducing chemical source and drain doping concentration, further reducing the need for a gate spacer. In other words, a lower (chemical) doping level of the first and second common regions of each channel layer may hence be used than for the (typically highly chemically doped) source and drain regions of the conventional FET. This may in turn reduce the degradation of the sub-threshold-swing (SS) as the gate length scales down. Moreover, a channel region may be induced to extend completely between the common regions of the source- and drain-side, thereby enabling a reduced short-channel effect (SCE) when down-scaling.

It is envisaged that such an alternative FET design may be fabricated using a similar approach as outlined for the FET 100, from a fin structure comprising a slightly modified alternating layer structure of channel layers and non-channel layers, wherein the non-channel layers are alternatingly first non-channel layers of a first layer material and second non-channel layers of a second layer material. S/D cavities may thereby be formed in the first non-channel layers employing an isotropic etch selective to the first non-channel material, while gate cavities may be formed in the second non-channel layers employing an isotropic etch selective to the second non-channel material. To facilitate forming of a set of vertically spaced apart insulating S/D spacer layers to separate each pair of S/D prongs, and the insulating spacer layer portions surrounding the gate prongs (e.g. corresponding to portions 116, 126 of FET 100) the first and second non-channel materials may be respective dielectric materials (e.g. an oxide and a nitride, respectively), e.g. provided in the fin structure using any of the abovementioned replacement approaches, or by patterning fin structures in a multi-layered SOI structure (e.g. Si/$SiO_2$/Si/SiN/Si/ . . . ).

Figure 3:
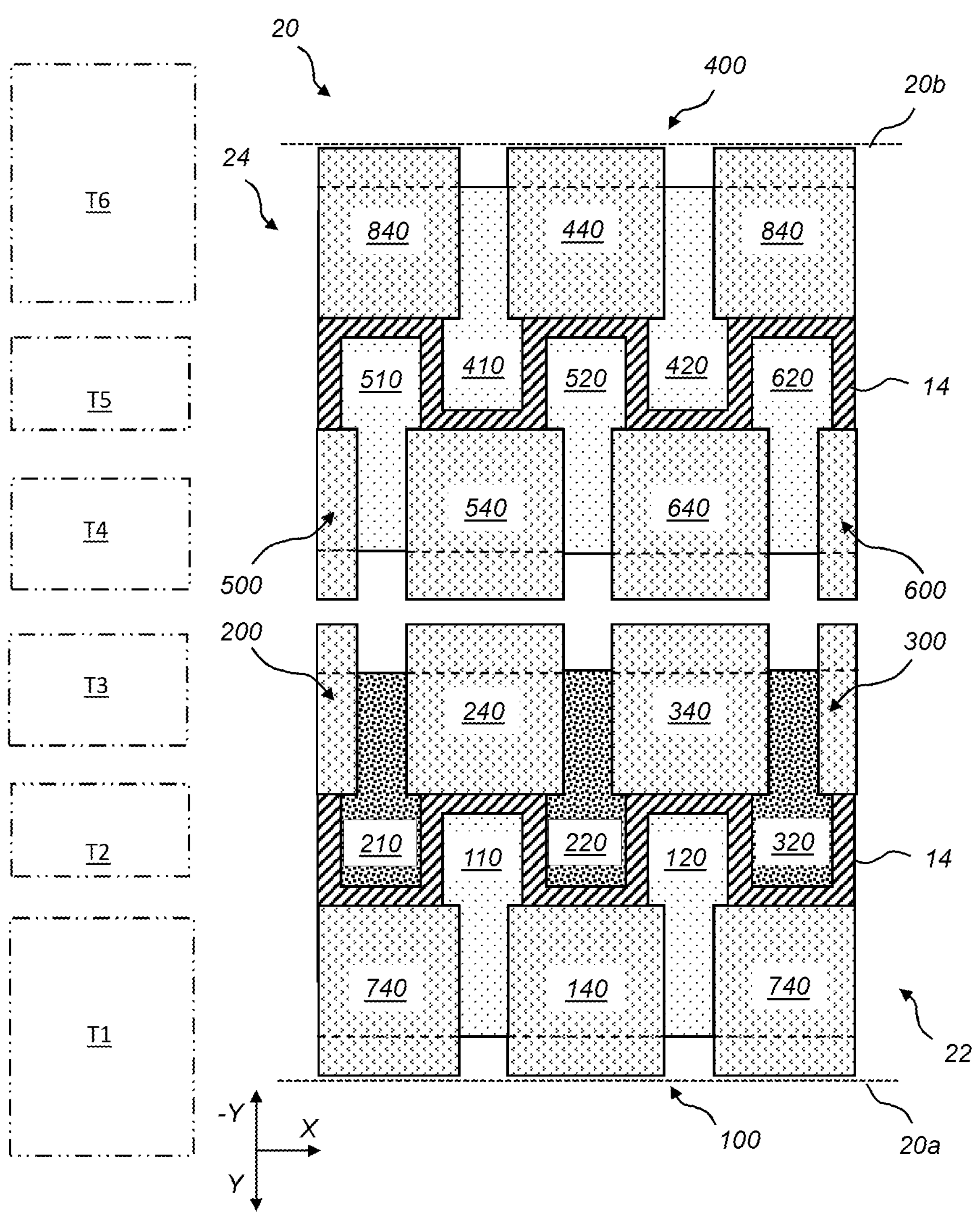
FIG. 3 is a schematic top-down view of a circuit cell in the form of an SRAM bit cell according to some embodiments.

The semiconductor device structure 10 of FIG. 2 may be used to form a circuit cell, such as a logic cell or a memory cell of a standard cell design. More than one such semiconductor device structure 10 may be combined in a same circuit cell to enable more complex circuitry. FIG. 3 is a schematic top-down view of a circuit cell 20 according to an embodiment. A physical layout of the circuit cell 20 may be described as comprising a first and a second half-cell 22, 24, wherein each half-cell comprises a semiconductor device structure corresponding to the semiconductor device structure 10. More specifically, the first half cell 22 comprises a first FET 100 and a second FET 200 corresponding to the first and second FETs 100, 200 of the device structure 10. To not overly obscure the drawing, only the overall gate and S/D structures of the respective FETs are indicated with reference signs and sub-elements thereof (e.g. S/D prongs and gate prongs) will hence in the following be made without individual reference signs. This applies also the respective channel structures and channel layers.

The first half cell 22 further comprises a third FET 300. The third FET 300 comprises the fourth S/D structure 220, a fifth S/D structure 320, a third channel structure (hidden from view due to the gate structure 340) comprising a set of vertically spaced apart channel layers extending between the fourth and fifth S/D structures 220, 320 in the X-direction, and a third gate structure 340.

The previous discussion of the fourth S/D structure 220 applies correspondingly to this embodiment, with the further addition that the fourth set of S/D prongs 224 (shown in FIG. 2) further contact the third channel structure of the third FET 300. The fourth S/D structure 220 is hence shared by the second and third FETs 200, 300. The fifth S/D structure 320 comprises a fifth S/D body, and a fifth set of vertically spaced apart S/D prongs protruding laterally from the fifth S/D body in the −Y-direction (i.e. in the same direction as the third and fourth sets of S/D prongs) to contact the third channel structure. The description of the third and fourth S/D structures 210, 220 in connection with FIG. 2 otherwise applies correspondingly to the fifth S/D structure 320. The third gate structure 340 comprises a third gate body and a third set of gate prongs protruding laterally from the third gate body in Y-direction (i.e. in the same direction as the second set of gate prongs), into spaces between the channel layers of the third channel structure. Further, the second S/D body 122 of the first FET 100 is as shown arranged between the fourth and fifth S/D bodies of the fourth and fifth S/D structures 220, 320).

The second half-cell 24 comprises a corresponding set of a first, second and a third FET 400, 500, 600. The layout of the FETs 400, 500, 600 of the second half-cell 24 is however mirrored compared to the layout of the first half-cell 22, wherein the first gate body of the first gate structure 140 of the first FET 100 of the first half-cell is arranged along a lower cell boundary 20*a* of the circuit cell 20, and wherein the first gate body of the first gate structure 440 of the first FET 400 of the second half-cell 24 is arranged along an opposite upper cell boundary 20*b* of the circuit cell 20. Furthermore, the S/D prongs of the S/D structures 410, 420 of the first FET 400 of the second half-cell 24 protrude in the −Y-direction. The S/D prongs of the S/D structures 510, 520 of the second FET 500 of the second half-cell 24 protrude in the Y-direction. The S/D prongs of the second S/D structure 620 of the third FET 600 of the second half-cell 24 protrude in the Y-direction. The gate prongs of the first gate structure 440 of the second half-cell 24 protrude in the −Y-direction. The gate prongs of the second and third gate structures 540, 640 of the second half-cell 24 protrude in the Y-direction.

FIG. 3 further schematically indicates first through sixth parallel routing tracks T1, T2, T3, T4, T5, T6 of the circuit cell 20. The routing tracks T1-T6 extend in the X-direction (corresponding to a width dimension of the circuit cell 20) and are spaced apart along the Y-direction (corresponding to a height dimension of the circuit cell 22). The first and sixth routing tracks T1, T6 define edge tracks of the circuit cell 20, respectively overlapping the lower and upper cell boundaries 20*a*-*b*.

The first gate structure 140 of the first FET 100 of the first half-cell 22 is arranged along the first routing track T1. The first, second, third, fourth and fifth S/D bodies of the first, second, third, fourth and fifth S/D structures 110, 120, 210, 220, 320 of the first, second and third FETs 100, 200, 300 are arranged along the second routing track T2. The second and third gate structures 240, 340 (i.e. the gate bodies and/or the gate prongs thereof) of the second and third FETs 200, 300 are arranged along the third routing track T3.

Correspondingly, the first gate structure 440 of the first FET 400 of the second half-cell 24 is arranged along the sixth routing track T6. The first, second, third, fourth and fifth S/D bodies of the first, second, third, fourth and fifth S/D structures 410, 420, 510, 520, 620 of the second, third and fourth FETs 400, 500, 600 are arranged along the fifth routing track T5. The second and third gate structures 540, 640 (i.e. the gate bodies and/or the gate prongs thereof) of the second and third FETs 500, 600 are arranged along the fourth routing track T4. The routing tracks T1-T6 may be populated by respective metal lines, e.g. in a bottom interconnect level (e.g. M0) of a back-end-of-line (BEOL) interconnect structure.

The circuit cell 20 may as shown further comprise first and second pairs of dummy gate structures 740, 840 arranged along the first and sixth routing track T1, T6, respectively. The first gate structure 140 of the first half-cell 22 is arranged between the first pair of dummy gate structures 740, and the first gate structure 440 of the second half-cell 24 is arranged between the second pair of dummy gate structures 840. The dummy gate structures 740, 840 may be metal gates but disconnected from surrounding circuitry such that they do not define functional gates.

FIG. 3 adopts the same fill patterns of the S/D structures as in FIG. 2. Hence, as shown in FIG. 3, the second and third FET 200, 300 of the first half-cell 22 may be P-type FETs while the further FETs 100, 400, 500, 600 may be N-type FETs. This combination of P-type and N-type FETs lends itself favorably to implement an SRAM bit cell, wherein the second and third P-type FETs 200, 300 of the first half-cell 22 may be configured as first and second pull-up transistors (PU1, PU2), the second and third N-type FETs 500, 600 of the second half-cell may be configured as first and second pull-down transistors (PD1, PD2), and the first N-type FETs 100, 400 of the first and second half-cells 22, 24 may be configured as first and second pass gates (PG1, PG2).

Signal routing within the circuit cell 20 and to/from the circuit cell 20 may be provided in various ways, e.g. by a combination of local interconnects (e.g. for intra-cell signal routing) and metal lines and vias in one or more interconnect levels of the BEOL interconnect structure (e.g. M0, M1, etc.).

As one non-limiting example, the first gate structures 140, 440 of the first FETs 100, 400 may be connected to a respective wordline (WL) arranged along the first and sixth routing tracks T1, T6. The wordlines WL may in turn be connected to a global WL arranged in M1 and extending in the Y-direction.

The second S/D structure 120 of the first FET 100 (PG1) and the first S/D structure 410 of the first FET 400 (PG2) may be respectively connected to a bitline (BL) arranged along the second routing track T2, and a complementary bitline (BLB) arranged along the fifth routing track T5.

A first storage node Q may be provided by a first and second local interconnect (e.g. below M0) extending in the Y-direction and interconnected by a metal line arranged along the fourth routing track T4. The first local interconnect may interconnect the second S/D structure 320 of the third FET 300 (PU2) and the second S/D structure 620 of the third FET 600 (PD2). The second local interconnect may interconnect the first S/D structure 110 of the first FET 100 (PG1) and the second gate structures 240, 540 of the second FETs 200, 500 (PU1, PD1).

A second complementary storage node QB may be provided by a third and fourth local interconnect (e.g. below M0) extending in the Y-direction and interconnected by a metal line arranged along the second routing track T2. The third local interconnect may interconnect the second S/D structure 210 of the second FET 200 (PU1) and the second S/D structure 510 of the second FET 500 (PD1). The fourth local interconnect may interconnect the second S/D structure 420 of the first FET 400 (PG2) and the third gate structures 340, 640 of the third FETs 300, 600 (PU2, PD2).

Pull-up and pull-down voltage rails VDD and VSS may be provided as buried power rails, wherein the second S/D structure 220 shared by the second and third FETs 200, 300 (PU1, PU2) may be connected to the VDD rail by a first backside contact or via-to-BPR and the second S/D structure 520 shared by the second and third FETs 500, 600 (PD1, PD2) may be connected to the VSS rail by a second backside contact or via-to-BPR.

As would be realized by a skilled person, a plurality of such SRAM bit cells 20 may be combined in an array of bit cells of an SRAM device.

While in the above, a circuit cell 20 has been described in the context of an SRAM bit cell, this is only one example use case the semiconductor device structure 10 as disclosed herein may be used to realize other types of logic and memory cells.

The present disclosure has mainly been described with reference to a limited number of examples. However, as is readily appreciated by a person skilled in the art, other examples than the ones disclosed above are equally possible within the scope of the present disclosure, as defined by the appended claims.

What is claimed is:

1. A semiconductor device structure comprising:

a first field-effect transistor, FET comprising:

a first source/drain, S/D, structure, a second S/D structure, a first channel structure comprising a set of vertically spaced apart channel layers extending between the first and second S/D structures in a channel direction, and a first gate structure, the first S/D structure comprising a first S/D body and a first set of vertically spaced apart S/D prongs protruding laterally from the first S/D body, transverse to the channel direction, to contact the first channel structure, the second S/D structure comprising a second S/D body and a second set of vertically spaced apart S/D prongs protruding laterally from the second S/D body in a same direction as the first set of S/D prongs, to contact the first channel structure, and the first gate structure comprising a first gate body and a first set of gate prongs protruding laterally from the first gate body in an opposite direction to the first and second sets of S/D prongs, into spaces between the channel layers of the first channel structure; and a second FET comprising:

a third S/D structure, a fourth S/D structure, a second channel structure comprising a set of vertically spaced apart channel layers extending between the third and fourth S/D structures in the channel direction, and a second gate structure, the third S/D structure comprising a third S/D body and a third set of vertically spaced apart S/D prongs protruding laterally from the third S/D body in the same direction as the first set of gate prongs, to contact the second channel structure, the fourth S/D structure comprising a fourth S/D body and a fourth set of vertically spaced apart S/D prongs protruding laterally from the fourth S/D body in the same direction as the third set of S/D prongs, to contact the second channel structure, and the second gate structure comprising a second gate body and a second set of gate prongs protruding from the second gate body in the same direction as the first and second sets of S/D prongs, into spaces between the channel layers of the second channel structure; and wherein the first S/D body is arranged between the third and fourth S/D bodies and the fourth S/D body is arranged between the first and second S/D bodies.

2. The semiconductor device structure of claim 1, further comprising a dielectric spacer layer separating the first S/D body from the third and fourth S/D bodies, and the fourth S/D body from the first and second S/D bodies.

3. The semiconductor device structure of claim 2, wherein the S/D prongs comprise semiconductor material and the S/D bodies comprise semiconductor material and/or metal.

4. The semiconductor device structure of claim 2, wherein the dielectric spacer layer further separates the first S/D body from the second gate structure, and the fourth S/D body from the first gate structure.

5. The semiconductor device structure of claim 4, wherein the S/D prongs comprise semiconductor material and the S/D bodies comprise semiconductor material and/or metal.

6. The semiconductor device structure of claim 4, wherein the dielectric spacer layer extends continuously from the second S/D body to the third S/D body.

7. The semiconductor device structure of claim 6, wherein the S/D prongs comprise semiconductor material and the S/D bodies comprise semiconductor material and/or metal.

8. The semiconductor device structure of claim 1, wherein the S/D prongs comprise semiconductor material and the S/D bodies comprise semiconductor material and/or metal.

9. The semiconductor device structure of claim 1, further comprising a third FET comprising the fourth S/D structure, a fifth S/D structure, a third channel structure comprising a set of vertically spaced apart channel layers extending between the fourth and fifth S/D structures in the channel direction, and a third gate structure, wherein the fourth set of S/D prongs further contact the third channel structure, wherein the fifth S/D structure comprises a fifth S/D body, and a fifth set of vertically spaced apart S/D prongs protruding laterally from the fifth S/D body in the same direction as the third and fourth sets of S/D prongs, to contact the third channel structure, wherein the third gate structure comprises a third gate body and a third set of gate prongs protruding laterally from the third gate body in the same direction as the second set of gate prongs, into spaces between the channel layers of the third channel structure, and wherein the second S/D body is arranged between the fourth and fifth S/D bodies.

10. A circuit cell for an integrated circuit, the circuit cell comprising a semiconductor device structure including a first field-effect transistor, FET comprising:

a first source/drain, S/D, structure, a second S/D structure, a first channel structure comprising a set of vertically spaced apart channel layers extending between the first and second S/D structures in a channel direction, and a first gate structure, the first S/D structure comprising a first S/D body and a first set of vertically spaced apart S/D prongs protruding laterally from the first S/D body, transverse to the channel direction, to contact the first channel structure, the second S/D structure comprising a second S/D body and a second set of vertically spaced apart S/D prongs protruding laterally from the second S/D body in a same direction as the first set of S/D prongs, to contact the first channel structure, and the first gate structure comprising a first gate body and a first set of gate prongs protruding laterally from the first gate body in an opposite direction to the first and second sets of S/D prongs, into spaces between the channel layers of the first channel structure; and a second FET comprising:

a third S/D structure, a fourth S/D structure, a second channel structure comprising a set of vertically spaced apart channel layers extending between the third and fourth S/D structures in the channel direction, and a second gate structure, the third S/D structure comprising a third S/D body and a third set of vertically spaced apart S/D prongs protruding laterally from the third S/D body in the same direction as the first set of gate prongs, to contact the second channel structure, the fourth S/D structure comprising a fourth S/D body and a fourth set of vertically spaced apart S/D prongs protruding laterally from the fourth S/D body in the same direction as the third set of S/D prongs, to contact the second channel structure, and the second gate structure comprising a second gate body and a second set of gate prongs protruding from the second gate body in the same direction as the first and second sets of S/D prongs, into spaces between the channel layers of the second channel structure; and wherein the first S/D body is arranged between the third and fourth S/D bodies and the fourth S/D body is arranged between the first and second S/D bodies.

11. The circuit cell of claim 2, wherein the circuit cell comprises a first half-cell and a second half-cell, and wherein the first set of S/D prongs of the first S/D structure of the first FET of the first half-cell protrude in a first lateral direction and the first set of S/D prongs of the first S/D structure of the first FET of the second half-cell protrude in a second lateral direction opposite the first lateral direction.

12. The circuit cell of claim 11, wherein the first half-cell and the second half-cell each comprises a respective semiconductor device.

13. The circuit cell of claim 11, wherein the first gate body of the first FET of the first half-cell is arranged along a lower cell boundary of the circuit cell and wherein the first gate body of the first FET of the second half-cell is arranged along an upper cell boundary of the circuit cell.

14. The circuit cell of claim 13, wherein the first half-cell and the second half-cell each comprises a respective semiconductor device.

15. The circuit cell of claim 14, further comprising first through sixth routing tracks extending in parallel and spaced apart along a height dimension of the circuit cell, wherein the first and sixth routing tracks define edge tracks of the circuit cell, wherein in the first half-cell:

the first gate structure is arranged along the first routing track, the first, second, third, fourth and fifth S/D bodies of the first, second, third, fourth and fifth S/D structures are arranged along the second routing track, and the second and third gate structures are arranged along the third routing track, and wherein in the second half-cell:

the first gate structure is arranged along the sixth routing track, the first, second, third, fourth and fifth S/D bodies of the first, second, third, fourth and fifth S/D structures are arranged along the fifth routing track, and the second and third gate structures are arranged along the fourth routing track.

16. The circuit cell of claim 15, wherein the first FET of the first half-cell and each of the FETs of the second half-cell are N-type FETs, and wherein the second and third FETs of the first half-cell are P-type FETs.

17. The circuit cell of claim 15, wherein the first half-cell further comprises a first pair of dummy gate structures arranged along the first routing track, wherein the first gate structure of the first half-cell is arranged between the first pair of dummy gate structures, and wherein the second half-cell further comprises a second pair of dummy gate structures arranged along the sixth routing track, wherein the first gate structure of the second half-cell is arranged between the second pair of dummy gate structures.

18. The circuit cell of claim 17, wherein the first FET of the first half-cell and each of the FETs of the second half-cell are N-type FETs, and wherein the second and third FETs of the first half-cell are P-type FETs.

19. The circuit cell of claim 18, wherein the circuit cell forms a static random access memory, SRAM, bit cell.

20. A SRAM device comprising an array of bit cells according to claim 19.

* * * * *